(12) United States Patent
Deligianni et al.

(10) Patent No.: US 10,597,769 B2
(45) Date of Patent: Mar. 24, 2020

(54) METHOD OF FABRICATING A MAGNETIC STACK ARRANGEMENT OF A LAMINATED MAGNETIC INDUCTOR

(71) Applicant: International Business Machines Corporation, Armonk, NY (US)

(72) Inventors: Hariklia Deligianni, Alpine, NJ (US); Bruce B. Doris, Hartsdale, NY (US); Eugene J. O'Sullivan, Nyack, NY (US); Naigang Wang, Ossining, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/479,615

(22) Filed: Apr. 5, 2017

(65) Prior Publication Data
US 2018/0294094 A1 Oct. 11, 2018

(51) Int. Cl.
*H01F 7/06* (2006.01)
*C23C 14/06* (2006.01)
(Continued)

(52) U.S. Cl.
CPC .......... *C23C 14/0641* (2013.01); *C23C 14/10* (2013.01); *C23C 14/14* (2013.01);
(Continued)

(58) Field of Classification Search
CPC ............. H01F 17/0013; H01F 17/0033; H01F 41/046; C23C 16/401; C23C 14/14;
(Continued)

(56) References Cited

U.S. PATENT DOCUMENTS

| | | |
|---|---|---|
| 5,194,806 A | 3/1993 | Obama |
| 5,576,099 A | 11/1996 | Canaperi et al. |

(Continued)

FOREIGN PATENT DOCUMENTS

CN 102529211 A 7/2012

OTHER PUBLICATIONS

Deligianni et al., "Stress Management for Thick Magnetic Film Inductors," U.S. Appl. No. 16/391,383, filed Apr. 23, 2019.
(Continued)

*Primary Examiner* — Paul D Kim
(74) *Attorney, Agent, or Firm* — Cantor Colburn LLP; Vazken Alexanian

(57) ABSTRACT

Embodiments are directed to a method of forming a magnetic stack arrangement of a laminated magnetic inductor having a high frequency peak quality factor (Q). A first magnetic stack is formed having one or more magnetic layers alternating with one or more insulating layers in a first inner region of a laminated magnetic inductor. A second magnetic stack is formed opposite a surface of the first magnetic stack in an outer region of the laminated magnetic inductor. A third magnetic stack is formed opposite a surface of the second magnetic stack in a second inner region of the laminated magnetic inductor. The insulating layers are formed such that a thickness of an insulating layer in the second magnetic stack is greater than a thickness of an insulating layer in the first magnetic stack.

13 Claims, 7 Drawing Sheets

(51) Int. Cl.

| | | |
|---|---|---|
| C23C 16/06 | (2006.01) | |
| C23C 14/14 | (2006.01) | |
| C23C 16/40 | (2006.01) | |
| C23C 14/10 | (2006.01) | |
| H01F 41/04 | (2006.01) | |
| H01F 17/00 | (2006.01) | |
| C23C 16/34 | (2006.01) | |

(52) U.S. Cl.
CPC ............ *C23C 16/06* (2013.01); *C23C 16/345* (2013.01); *C23C 16/401* (2013.01); *H01F 17/0013* (2013.01); *H01F 17/0033* (2013.01); *H01F 41/046* (2013.01); *H01F 2017/0066* (2013.01)

(58) Field of Classification Search
CPC ... C23C 14/0641; C23C 14/10; C23C 16/345; C23C 16/06
See application file for complete search history.

(56) References Cited

U.S. PATENT DOCUMENTS

| | | |
|---|---|---|
| 5,756,201 A | 5/1998 | Kadono et al. |
| 5,774,025 A | 6/1998 | Adam et al. |
| 6,184,143 B1 | 2/2001 | Ohashi et al. |
| 6,346,336 B1 | 2/2002 | Nago |
| 6,377,157 B1 | 4/2002 | Liu et al. |
| 6,504,466 B1 | 1/2003 | Katsurada |
| 6,593,838 B2 | 7/2003 | Yue |
| 6,613,459 B1 | 9/2003 | Saito et al. |
| 6,630,255 B1 | 10/2003 | Litvinov et al. |
| 6,731,460 B2 | 5/2004 | Sasaki |
| 6,759,297 B1 | 7/2004 | Dvorsky et al. |
| 6,943,658 B2 | 9/2005 | Gardner |
| 6,982,196 B2 | 1/2006 | Belyansky et al. |
| 7,016,170 B2 | 3/2006 | Nishioka |
| 7,202,516 B2 | 4/2007 | Belyansky et al. |
| 7,238,990 B2 | 7/2007 | Burnett et al. |
| 7,380,328 B2 | 6/2008 | Ahn et al. |
| 7,488,659 B2 | 2/2009 | Dyer |
| 7,737,052 B2 | 6/2010 | Bhatia et al. |
| 7,755,124 B2 | 7/2010 | Fajardo et al. |
| 7,791,837 B2 | 9/2010 | Fujiwara |
| 7,847,668 B2 | 12/2010 | Lai et al. |
| 7,906,383 B2 | 3/2011 | Richter et al. |
| 7,936,246 B2 | 5/2011 | Hopper et al. |
| 7,982,286 B2 | 7/2011 | Rossi et al. |
| 8,044,755 B2 | 10/2011 | Smeys et al. |
| 8,049,993 B2 | 11/2011 | Shirotori et al. |
| 8,093,981 B2 | 1/2012 | Chung |
| 8,278,164 B2 | 10/2012 | Li et al. |
| 8,299,615 B2 | 10/2012 | Fayaz et al. |
| 8,308,964 B2 | 11/2012 | Xu et al. |
| 8,314,676 B1 | 11/2012 | Smeys et al. |
| 8,323,728 B2 | 12/2012 | Iorio et al. |
| 8,354,694 B2 | 1/2013 | Bedell et al. |
| 8,466,537 B1 | 6/2013 | Papou et al. |
| 8,587,400 B2 | 11/2013 | Nakajima et al. |
| 8,691,696 B2 | 4/2014 | Cai et al. |
| 8,698,328 B2 | 4/2014 | Nair et al. |
| 8,704,627 B2 | 4/2014 | Kuroda |
| 8,717,136 B2 | 5/2014 | Fontana, Jr. et al. |
| 8,736,413 B2 | 5/2014 | Yokoyama et al. |
| 8,749,338 B2 | 6/2014 | Takahashi |
| 8,823,482 B2 | 9/2014 | Singh et al. |
| 9,047,890 B1 | 6/2015 | Herget |
| 9,129,817 B2 | 9/2015 | Elsherbini et al. |
| 9,153,547 B2 | 10/2015 | Crawford et al. |
| 9,231,072 B2 | 1/2016 | Alptekin |
| 9,324,495 B2 | 4/2016 | Fontana, Jr. et al. |
| 9,356,121 B2 | 5/2016 | Jagannathan |
| 9,412,866 B2 | 8/2016 | Kuoh et al. |
| 9,437,668 B1 | 9/2016 | Deligianni et al. |
| 9,697,948 B2 | 7/2017 | Osada et al. |
| 9,799,519 B1 | 10/2017 | Joseph |
| 10,236,209 B2 | 3/2019 | Sharan et al. |
| 2001/0050607 A1 | 12/2001 | Gardner |
| 2003/0077871 A1 | 4/2003 | Cheng et al. |
| 2004/0046631 A1 | 3/2004 | Sakakura et al. |
| 2004/0219328 A1 | 11/2004 | Tasaki et al. |
| 2006/0222821 A1 | 10/2006 | Masai |
| 2007/0030659 A1 | 2/2007 | Suzuki et al. |
| 2007/0285835 A1 | 12/2007 | Sun et al. |
| 2008/0036536 A1 | 2/2008 | Khorramabadi |
| 2008/0284552 A1 | 11/2008 | Lim et al. |
| 2011/0050607 A1 | 3/2011 | Park |
| 2011/0133880 A1 | 6/2011 | Pitts et al. |
| 2011/0172111 A1 | 7/2011 | Cantor et al. |
| 2012/0233849 A1 | 9/2012 | Smeys et al. |
| 2012/0236528 A1 | 9/2012 | Le et al. |
| 2012/0267733 A1 | 10/2012 | Hu et al. |
| 2012/0319236 A1 | 12/2012 | Chen et al. |
| 2013/0056847 A1 | 3/2013 | Chen |
| 2013/0106552 A1 | 5/2013 | Fontana, Jr. et al. |
| 2013/0224887 A1 | 8/2013 | Lee et al. |
| 2014/0027880 A1 | 1/2014 | Duevel et al. |
| 2014/0062646 A1 | 3/2014 | Morrissey et al. |
| 2014/0068932 A1 | 3/2014 | Sturcken |
| 2014/0216939 A1 | 8/2014 | Fontana, Jr. et al. |
| 2014/0349414 A1 | 11/2014 | Zhong et al. |
| 2015/0109088 A1 | 4/2015 | Kim et al. |
| 2015/0115404 A1 | 4/2015 | Hsueh et al. |
| 2015/0137931 A1 | 5/2015 | Mano et al. |
| 2015/0171157 A1 | 6/2015 | Sturcken et al. |
| 2015/0187772 A1 | 7/2015 | Choi et al. |
| 2015/0338474 A1 | 11/2015 | Mohan et al. |
| 2015/0340149 A1 | 11/2015 | Lee et al. |
| 2016/0086960 A1 | 3/2016 | Wen et al. |
| 2016/0260708 A1 | 9/2016 | Herget et al. |
| 2017/0179154 A1 | 6/2017 | Furihata |
| 2017/0250134 A1 | 8/2017 | Sturcken et al. |
| 2018/0005741 A1 | 1/2018 | Doris et al. |
| 2018/0197670 A1 | 7/2018 | Deligianni et al. |
| 2018/0197671 A1 | 7/2018 | Deligianni et al. |
| 2018/0286581 A1* | 10/2018 | Deligianni .......... H01F 1/14708 |
| 2018/0308612 A1 | 10/2018 | Park et al. |
| 2018/0308920 A1 | 10/2018 | Deligianni et al. |
| 2018/0323158 A1* | 11/2018 | Deligianni ............ H01L 23/645 |
| 2019/0157000 A1* | 5/2019 | Deligianni .......... H01F 1/14708 |

OTHER PUBLICATIONS

List of IBM Patents or Patent Applications Treated As Related; Date Filed: May 22, 2019, 2 pages.

Deligianni et al.; "Magnetic Inductor Stack Including Magnetic Materials Having Multiple Permeabilites"; U.S. Appl. No. 15/966,202; filed Apr. 30, 2018.

List of IBM Patents or Patent Applications Treated As Related; Date Filed: Apr. 30, 2018, 2 pages.

Deligianni et al.; "Magnetic Inductor Stack Including Insulating Material Having Multiple Thicknesses"; U.S. Appl. No. 15/584,766; filed May 2, 2017.

Deligianni et al.; "Magnetic Inductor Stack Including Magnetic Materials Having Multiple Permeabilites"; U.S. Appl. No. 15/494,871; filed Apr. 24, 2017.

Deligianni et al.; "Magnetic Inductor With Multiple Magnetic Layer Thicknesses"; U.S. Appl. No. 15/473,725; filed Mar. 30, 2017.

Deligianni et al.; "Magnetic Inductor With Shape Anisotrophy"; U.S. Appl. No. 15/476,147; filed Mar. 31, 2017.

List of IBM Patents or Patent Applications Treated As Related; Date Filed: Jan. 15, 2018, 2 pages.

Deligianni et al., "Magnetic Inductor With Multiple Magnetic Layer Thicknesses", U.S. Appl. No. 16/236,795, filed Dec. 31, 2018.

E. Quandt et al., "Magnetostrictive LC circuit sensors," Materials Transactions, vol. 45, No. 2, 2004, pp. 244-248.

Gao, "Significantly Enhanced Inductance and Quality Factor of GHz Integrated Magnetic Solenoid Inductors With FeGaB/Al2O3 Multilayer Films", IEEE Transactions on Electron Devices, vol. 61, No. 5, May 2014, pp. 1470-1476, IEEE.

(56) References Cited

OTHER PUBLICATIONS

Iakubov et al., "Control over magnetic spectrum of multilayer magnetic film metamaterial," AIP Advances, vol. 5, No. 7, 2015, 077116, 7 pages.
List of IBM Patents or Patent Applications Treated As Related; (Appendix P), Date Filed Jul. 5, 2018; 2 pages.
Deligianni et al., " Stress Management for Thick Magnetic Film Inductors," U.S. Appl. No. 15/599,754, filed May 19, 2017.
Deligianni et al., " Stress Management for Thick Magnetic Film Inductors," U.S. Appl. No. 16/107,102, filed Aug. 21, 2018.
Deligianni et al., "Magnetic Inductor Stacks," U.S. Appl. No. 15/403,292, filed Jan. 11, 2017.
Deligianni et al., "Magnetic Inductor Stacks," U.S. Appl. No. 15/800,702, filed Nov. 1, 2017.
List of IBM Patents or Patent Applications Treated As Related; (Appendix P), Date Filed Oct. 10, 2018; 2 pages.
Deligianni et al., "Laminated Magnetic Inductor Stack With High Frequency Peak Quality Factor," U.S. Appl. No. 16/591,964, filed Oct. 3, 2019.
Deligianni et al., "Magnetic Inductor With Shape Anisotrophy," U.S. Appl. No. 16/591,954, filed Oct. 3, 2019.
List of IBM Patents or Patent Applications Treated As Related; Date Filed: Oct. 22, 2019, 2 pages.

\* cited by examiner

METHOD OF FABRICATING A MAGNETIC STACK ARRANGEMENT OF A LAMINATED MAGNETIC INDUCTOR

BACKGROUND

The present invention generally relates to fabrication methods and resulting structures for on-chip magnetic devices. More specifically, the present invention relates to on-chip magnetic structures, e.g., a laminated magnetic inductor stack, having a high frequency peak quality factor.

Inductors, resistors, and capacitors are the main passive elements constituting an electronic circuit. Inductors are used in circuits for a variety of purposes, such as in noise reduction, inductor-capacitor (LC) resonance calculators, and power supply circuitry. Inductors can be classified as one of various types, such as a winding-type inductor or a laminated film-type inductor. Winding-type inductors are manufactured by winding a coil around, or printing a coil on, a ferrite core. Laminated film-type inductors are manufactured by stacking alternating magnetic or dielectric materials to form laminated stacks.

Among the various types of inductors the laminated film-type inductor is widely used in power supply circuits requiring miniaturization and high current due to the reduced size and improved inductance per coil turn of these inductors relative to other inductor types. A known laminated inductor configuration includes one or more magnetic or dielectric layers laminated with conductive patterns. The conductive patterns are sequentially connected by a conductive via formed in each of the layers and overlapped in a laminated direction to form a spiral-structured coil. Typically, both ends of the coil are drawn out to an outer surface of a laminated body for connection to external terminals.

SUMMARY

Embodiments of the present invention are directed to a method for fabricating a magnetic stack arrangement of a laminated magnetic inductor. A non-limiting example of the method includes forming a first magnetic stack having one or more magnetic layers alternating with one or more insulating layers in a first region of a laminated magnetic inductor. A second magnetic stack is formed having one or more magnetic layers alternating with one or more insulating layers opposite a surface of the first magnetic stack in an outer region of the laminated magnetic inductor. A third magnetic stack is formed having one or more magnetic layers alternating with one or more insulating layers opposite a surface of the second magnetic stack in a second inner region of the laminated magnetic inductor. The insulating layers are formed such that a thickness of an insulating layer in the second magnetic stack is greater than a thickness of an insulating layer in the first magnetic stack.

Embodiments of the present invention are directed to a method for fabricating a magnetic stack arrangement of a laminated magnetic inductor. A non-limiting example of the method includes forming a first insulating layer proximate to a conductive coil of the laminated magnetic inductor. A second insulating layer is formed proximate to the conductive coil opposite a surface of the first insulating layer. A third insulating layer is formed between the first and second insulating layers such that the third insulating layer is further from the conductive coil than either the first insulating layer or the second insulating layer. The insulating layers are formed such that a thickness of the third insulating layer is greater than a thickness of either the first or second insulating layers.

Embodiments of the present invention are directed to a laminated magnetic inductor. A non-limiting example of the laminated magnetic inductor includes a first inner region having one or more magnetic layers alternating with one or more insulating layers. An outer region having one or more magnetic layers alternating with one or more insulating layers is formed opposite a surface of the first inner region. A second inner region having one or more magnetic layers alternating with one or more insulating layers is formed opposite a surface of the outer region. The insulating layers are formed such that a thickness of an insulating layer in the outer region is greater than a thickness of an insulating layer in either the first or second inner regions.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification.

The foregoing and other features and advantages of the embodiments of the invention are apparent from the following detailed description taken in conjunction with the accompanying drawings in which.

Figure 1:
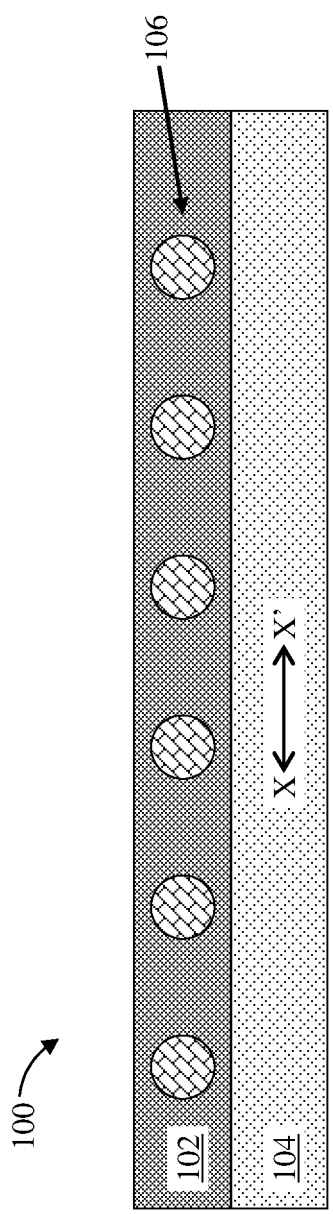
FIG. 1 depicts a laminated magnetic inductor after a fabrication operation according to embodiments of the invention.

The diagrams depicted herein are illustrative. There can be many variations to the diagram or the operations described therein without departing from the spirit of the invention. For instance, the actions can be performed in a differing order or actions can be added, deleted or modified.

In the accompanying figures and following detailed description of the disclosed embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of laminated inductor devices are well known and so, in the interest of brevity, many conventional steps will only be mentioned briefly herein or will be omitted entirely without providing the well-known process details.

Turning now to an overview of technologies that are more specifically relevant to aspects of the invention, as previously noted herein, laminated film-type inductors offer reduced size and improved inductance per coil turn relative to other inductor types. For this reason, laminated film-type inductors are widely used in applications requiring miniaturization and high current, such as power supply circuitry. The integration of inductive power converters onto silicon is one path to reducing the cost, weight, and size of electronic devices.

Laminated film-type inductor performance can be improved by adding layers of magnetic film. There are two basic laminated film-type magnetic inductor configurations: the closed yoke type laminated inductor and the solenoid type laminated inductor. The closed yoke type laminated inductor includes a metal core (typically a copper wire) and magnetic material wrapped around the core. Conversely, the solenoid type laminated inductor includes a magnetic material core and a conductive wire (e.g., copper wire) wrapped around the magnetic material. Both the closed yoke type laminated inductor and the solenoid type laminated inductor benefit by having very thick magnetic stacks or yokes (e.g., magnetic layers having a thickness of greater than about 50 nm). Thick magnetic layers offer faster throughput and are significantly more efficient to deposit. There are challenges, however, in providing laminated film-type inductor architectures having thick magnetic layers.

One such challenge is addressing the increased loss in energy due to the powerful eddy currents associated with inductors having multiple dielectric layer thicknesses. Eddy currents (also known as Foucault currents) are loops of electrical current induced by a changing magnetic field in a conductor. Eddy currents flow in closed loops within conductors in a plane perpendicular to the magnetic field. Eddy currents are created when the time varying magnetic fields in the magnetic layers create an electric field that drives a circular current flow. These losses can be substantial and increase with the thickness of the magnetic layers.

The magnetic loss caused by eddy currents in a thick film inductor is largest in the region of the inductor where the coil is in close proximity to the magnetic material. Specifically, magnetic layers closer to the coil (that is, the "inner layers") have larger losses than magnetic layers further from the coil (the "outer layers"). Moreover, magnetic flux densities in the space occupied by inner layers are generally higher than those characterizing the outer layers due to the magnetic reluctance of the insulating layers (also called spacer layers) interposed between the winding and the outer layers. Due to these relatively large magnetic flux densities in the space occupied by the inner layers, the inner layers tend to magnetically saturate at lower drive currents and have greater losses than the outer layers. Accordingly, the inner layer region is a critical region—the losses in this critical region dominate the overall losses of the inductor.

As magnetic film thicknesses increase, the eddy currents become severe enough to degrade the quality factor (also known as "Q") of the inductor. The quality factor of an inductor is the ratio of its inductive reactance to its resistance at a given frequency, and is a measure of its efficiency. The maximum attainable quality factor for a given inductor across all frequencies is known as peak Q (or maximum Q). Some applications can require the peak Q to be at a low frequency and other applications can require the peak Q to be at a high frequency.

Turning now to an overview of the aspects of the invention, one or more embodiments of the invention address the above-described shortcomings by providing methods of fabricating a laminated magnetic inductor having a high frequency peak Q. The frequency at which peak Q occurs for a given inductor is, in general, inversely proportional to permeability. Permeability ($\mu$) is the degree of magnetization that a material obtains in response to an applied magnetic field. Incorporating materials with high permeability in an inductor increases losses and shifts the frequency of peak Q to a higher frequency.

By patterning specific regions of the inductor into laminations having thin or thick dielectric layers the frequency of peak Q can be adjusted. In particular, inner regions of the inductor (i.e., those critical regions proximate to the conductive coil) are patterned with laminations having thin dielectric layers to increase the effective permeability of the inner layers and to shift the frequency of peak Q to a higher frequency. In this manner, eddy current losses in the critical regions of the inductor are leveraged to modulate the frequency of peak Q. The outer regions of the inductor (i.e., those regions positioned farther away from the conductive coil than the inner regions) are patterned with laminations having thick dielectric layers. Patterning the outer layers with thick dielectric layers decreases the effective permeability of these layers and reduces losses.

Turning now to a more detailed description of aspects of the present invention, FIG. 1 depicts a cross-sectional view of a structure 100 along a direction X-X' having a dielectric layer 102 (also referred to as a bottom dielectric layer) formed opposite a surface of a substrate 104 during an intermediate operation of a method of fabricating a semiconductor device according to embodiments of the invention. The dielectric layer 102 can be any suitable material, such as, for example, a low-k dielectric, silicon nitride (SiN), silicon dioxide ($SiO_2$), silicon oxynitride (SiON), and silicon oxycarbonitride (SiOCN). Any known manner of forming the dielectric layer 102 can be utilized. In some embodiments, the dielectric layer 102 is $SiO_2$ conformally formed on exposed surfaces of the substrate 104 using a conformal deposition process such as PVD, CVD, plasma-enhanced CVD (PECVD), or a combination thereof. In some embodiments, the dielectric layer 102 is conformally formed to a thickness of about 50 nm to about 400 nm, although other thicknesses are within the contemplated scope of embodiments of the invention.

The substrate 104 can be a wafer and can have undergone known semiconductor front end of line processing (FEOL), middle of the line processing (MOL), and back end of the line processing (BEOL). FEOL processes can include, for example, wafer preparation, isolation, well formation, gate patterning, spacer, extension and source/drain implantation, and silicide formation. The MOL can include, for example, gate contact formation, which can be an increasingly challenging part of the whole fabrication flow, particularly for lithography patterning. In the BEOL, interconnects can be fabricated with, for example, a dual damascene process using PECVD deposited interlayer dielectric (ILDs), PVD metal barriers, and electrochemically plated conductive wire materials. The substrate 104 can include a bulk silicon substrate or a silicon on insulator (SOI) wafer. The substrate 104 can be made of any suitable material, such as, for example, Ge, SiGe, GaAs, InP, AlGaAs, or InGaAs.

A conductive coil 106 is formed in the dielectric layer 102 and a dielectric layer 600 (depicted in FIG. 6) and helically around portions of the structure 100. The conductive coil 106 can be formed by, for example, depositing copper lines in the dielectric layer 102, forming vias on top of the copper lines, and then depositing copper lines on top of the vias in the dielectric layer 600. For ease of discussion reference is made to operations performed on and to a conductive coil 106 having six turns or windings formed in the dielectric layer 102 (e.g., the conductive coil 106 wraps through the dielectric layer 102 a total of six times). It is understood, however, that the dielectric layer 102 can include any number of windings. For example, the dielectric layer 102 can include a single winding, 2 windings, 5 windings, 10 windings, or 20 windings, although other winding counts are within the contemplated scope of embodiments of the invention. The conductive coil 106 can be made of any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials.

Figure 2:
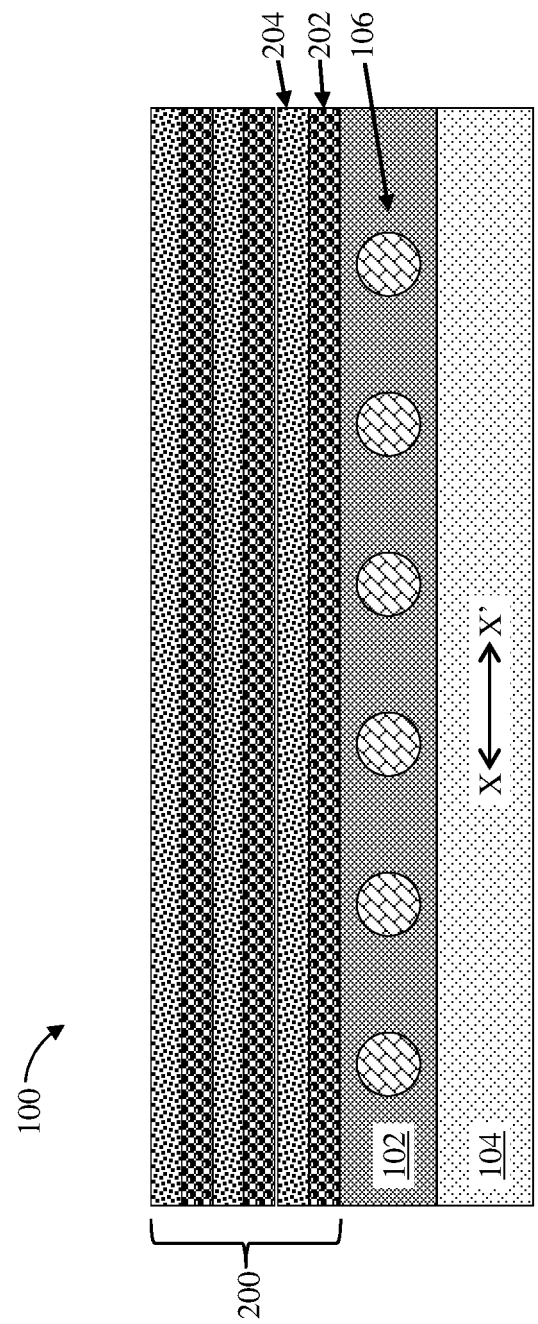
FIG. 2 depicts a laminated magnetic inductor after a fabrication operation according to embodiments of the invention.

FIG. 2 depicts a cross-sectional view of the structure 100 along the direction X-X' after forming a first inner layer region 200 opposite a surface of the dielectric layer 102 during an intermediate operation of a method of fabricating a semiconductor device according to embodiments of the invention. The first inner layer region 200 (also referred to as a magnetic stack) includes one or more inner magnetic layers (e.g., inner magnetic layer 202) alternating with one or more insulating layers (e.g., insulating layer 204). The first inner layer region 200 is formed by depositing alternating magnetic and insulating layers. For ease of discussion the first inner layer region 200 is depicted as having three inner magnetic layers alternating with three insulating layers. It is understood, however, that the first inner layer region 200 can include any number of inner magnetic layers alternating with a corresponding number of insulating layers. For example, the first inner layer region 200 can include a single inner magnetic layer, two inner magnetic layers, five inner magnetic layers, eight inner magnetic layers, or any number of inner magnetic layers, along with a corresponding number of insulating layers (i.e., as appropriate to form an inner layer region having a topmost insulating layer on a topmost inner magnetic layer and an insulating layer between each pair of adjacent inner magnetic layers).

The inner magnetic layer 202 can be made of any suitable magnetic material known in the art, such as, for example, a ferromagnetic material, soft magnetic material, iron alloy, nickel alloy, cobalt alloy, ferrites, plated materials such as permalloy, or any suitable combination of these materials. In some embodiments, the inner magnetic layer 202 includes a Co containing magnetic material, FeTaN, FeNi, FeAlO, or combinations thereof. Any known manner of forming the inner magnetic layer 202 can be utilized. The inner magnetic layer 202 can be deposited through vacuum deposition technologies (i.e., sputtering) or electrodepositing through an aqueous solution. In some embodiments, the inner magnetic layer 202 is conformally formed on exposed surfaces of the dielectric layer 102 using a conformal deposition process such as PVD, CVD, PECVD, or a combination thereof. In some embodiments, the inner magnetic layer 202 is conformally formed to a thickness of about 50 nm to about 500 nm, although other thicknesses are within the contemplated scope of embodiments of the invention.

The insulating layer 204 serves to isolate the adjacent magnetic material layers from each other in the stack and can be made of any suitable non-magnetic insulating material known in the art, such as, for example, aluminum oxides (e.g., alumina), silicon oxides (e.g., $SiO_2$), silicon nitrides, silicon oxynitrides ($SiO_xN_y$), polymers, magnesium oxide (MgO), or any suitable combination of these materials. Any known manner of forming the insulating layer 204 can be utilized. In some embodiments, the insulating layer 204 is conformally formed on exposed surfaces of the inner magnetic layer 202 using a conformal deposition process such as PVD, CVD, PECVD, or a combination thereof.

As discussed previously herein, the target thickness of the insulating layers in the first inner layer region 200 (e.g., insulating layer 204) is adjusted to increase the effective permeability of the inner layers and to shift the frequency of peak Q to a higher frequency. The insulating layer 204 is conformally formed to a relatively thin thickness (i.e., a thickness of about 0.5 nm to about 20 nm, although other thicknesses are within the contemplated scope of embodiments of the invention) to increase losses and to shift the frequency of peak Q to a higher frequency. In some embodiments, the thickness of the insulating layer 204 can be 0.5 nm, 1 nm, 2 nm, 3 nm, 4 nm, 5 nm, 10 nm, 15 nm, and 20 nm.

Figure 3:
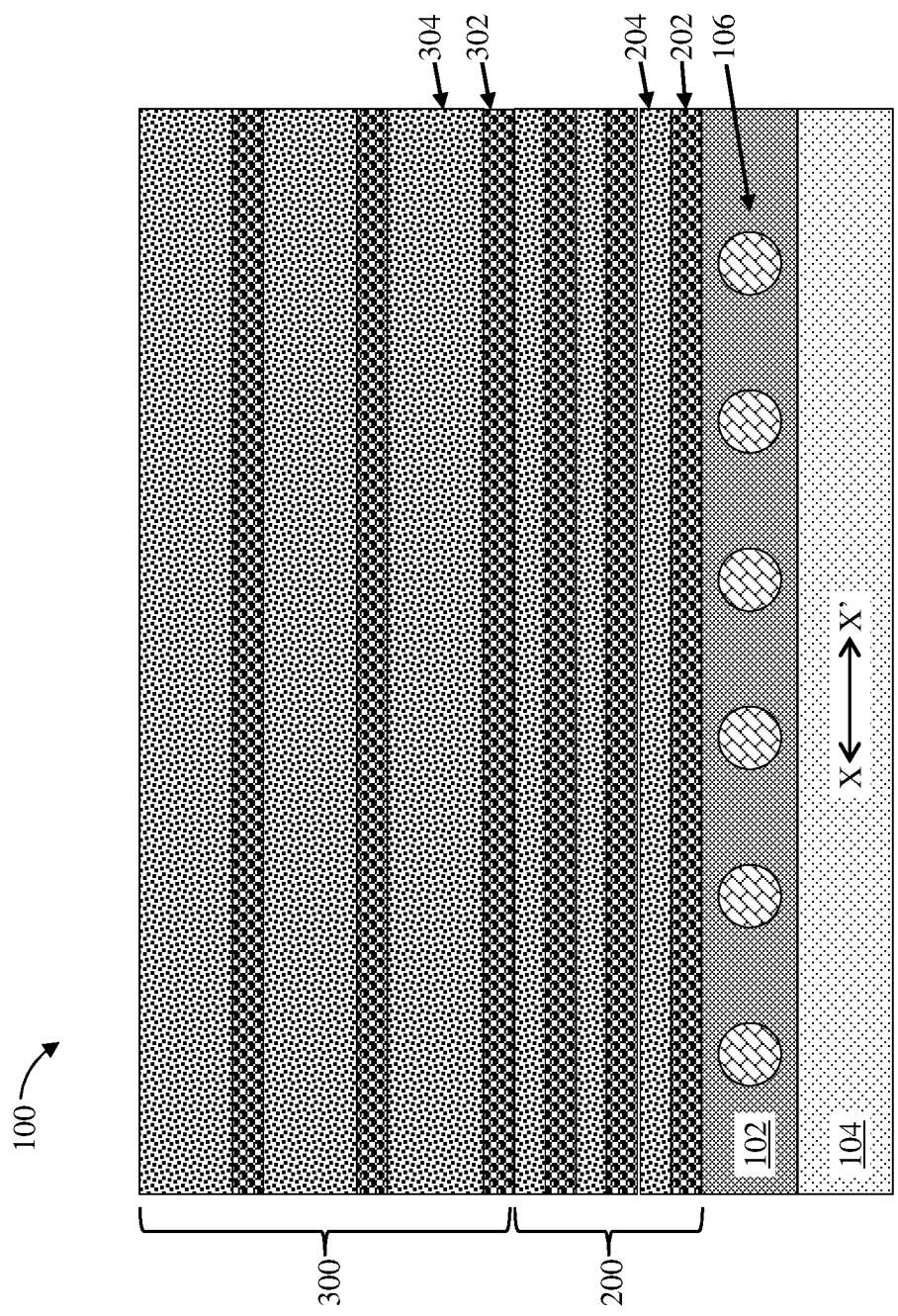
FIG. 3 depicts a laminated magnetic inductor after a fabrication operation according to embodiments of the invention.

FIG. 3 depicts a cross-sectional view of the structure 100 along the direction X-X' after forming an outer layer region 300 opposite a surface of the first inner layer region 200 during an intermediate operation of a method of fabricating a semiconductor device according to embodiments of the invention. The outer layer region 300 includes one or more outer magnetic layers (e.g., outer magnetic layer 302) alternating with one or more insulating layers (e.g., insulating layer 304). The outer layer region 300 is formed in a similar manner as the first inner layer region 200—by depositing alternating magnetic and insulating layers. For ease of discussion the outer layer region 300 is depicted as having three outer magnetic layers alternating with three insulating layers. It is understood, however, that the outer layer region 300 can include any number of outer magnetic layers alternating with a corresponding number of insulating layers. For example, the outer layer region 300 can include a single outer magnetic layer, two outer magnetic layers, five outer magnetic layers, eight outer magnetic layers, or any number of outer magnetic layers, along with a corresponding number of insulating layers (i.e., as appropriate to form an outer layer region having a topmost insulating layer on a topmost outer magnetic layer and an insulating layer between each pair of adjacent outer magnetic layers). It is further understood that the outer layer region 300 can include a different number of magnetic layers than the first inner layer region 200.

The outer magnetic layer 302 can be made of any suitable magnetic material and can be formed using any suitable process in a similar manner as the inner magnetic layer 202. In some embodiments, the outer magnetic layer 302 is conformally formed to a thickness of about 50 nm to about 500 nm, although other thicknesses are within the contemplated scope of embodiments of the invention. The outer magnetic layer 302 can have a same thickness, a larger thickness, or a smaller thickness as the inner magnetic layer 202 in the first inner layer region 200.

The insulating layer 304 can be made of any suitable non-magnetic insulating material and can be formed using any suitable process in a similar manner as the insulating layer 204. As discussed previously herein, the insulating layer 304 in the outer layer region 300 is formed to a relatively large thickness (i.e., a thickness of at least 50 nm) to decrease the effective permeability of these layers and to reduce losses. In some embodiments, the insulating layer 204 is conformally formed to a thickness of about 100 nm to about 1 µm. The thickness of the insulating layer 304 in the outer layer region 300 is greater than the thickness of the insulating layer 204 in the first inner layer region 200. In some embodiments, the thickness of the insulating layer 304 is two times, three times, four times, five times, ten times, twenty times, or fifty times the thickness of the insulating layer 204, although other thicknesses are within the contemplated scope of embodiments of the invention.

Figure 4:
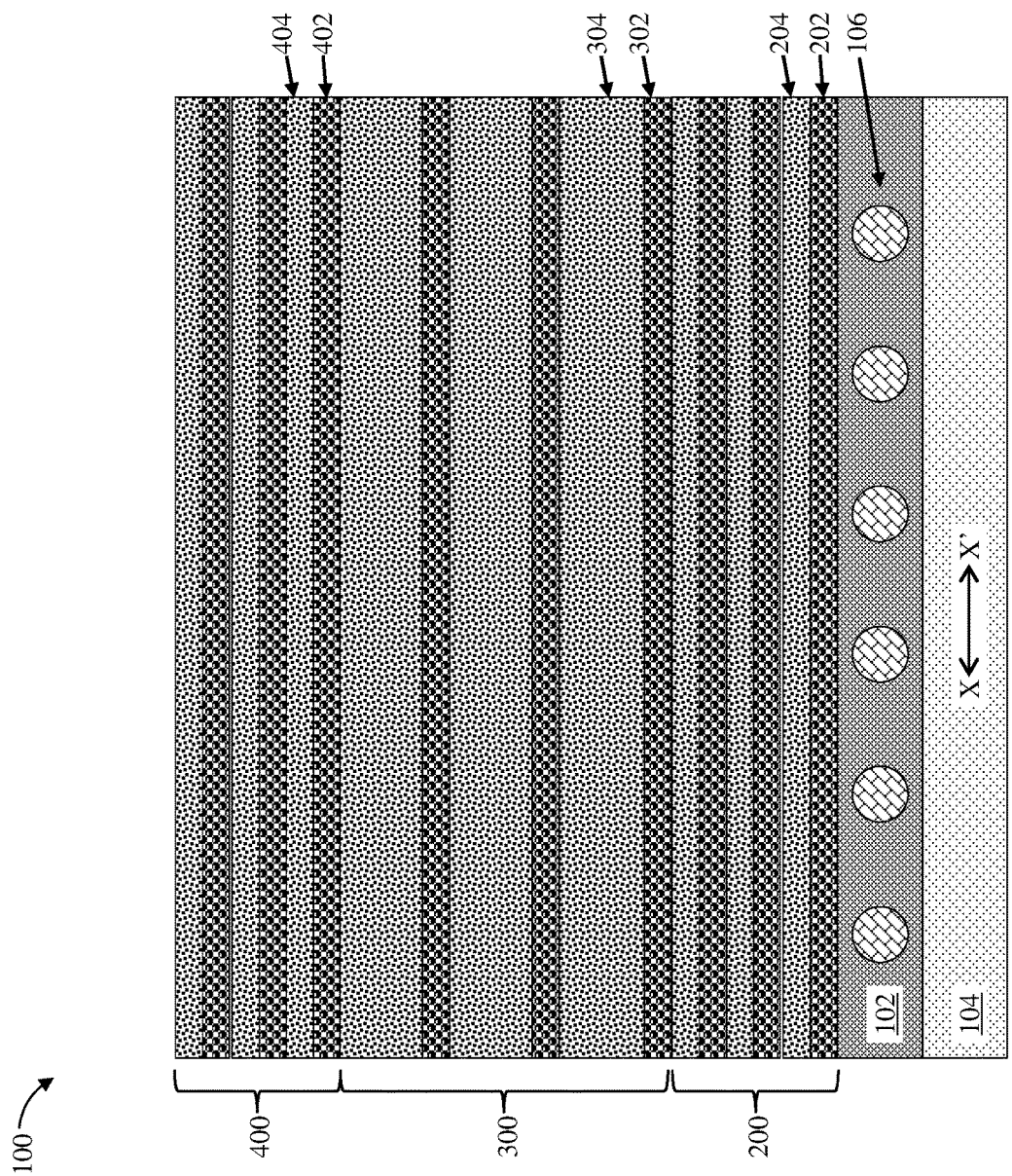
FIG. 4 depicts a laminated magnetic inductor after a fabrication operation according to embodiments of the invention.

FIG. 4 depicts a cross-sectional view of the structure 100 along the direction X-X' after forming a second inner layer region 400 opposite a surface of the outer layer region 300 during an intermediate operation of a method of fabricating a semiconductor device according to embodiments of the invention. The second inner layer region 400 includes one or more outer magnetic layers (e.g., second inner magnetic layer 402) alternating with one or more insulating layers (e.g., insulating layer 404). The second inner layer region 400 is formed in a similar manner as the first inner layer region 200—by depositing alternating magnetic and insulating layers. For ease of discussion the second inner layer region 400 is depicted as having three outer magnetic layers alternating with three insulating layers. It is understood, however, that the second inner layer region 400 can include any number of outer magnetic layers alternating with a corresponding number of insulating layers. For example, the second inner layer region 400 can include a single outer magnetic layer, two outer magnetic layers, five outer magnetic layers, eight outer magnetic layers, or any number of outer magnetic layers, along with a corresponding number of insulating layers (i.e., as appropriate to form an inner layer region having a topmost insulating layer on a topmost outer magnetic layer and an insulating layer between each pair of adjacent outer magnetic layers). It is further understood that the second inner layer region 400 can include a different number of magnetic layers than the first inner layer region 200.

The second inner magnetic layer 402 can be made of any suitable magnetic material and can be formed using any suitable process in a similar manner as the inner magnetic layer 202. In some embodiments, the second inner magnetic layer 402 is conformally formed to a thickness of about 50 nm to about 500 nm, although other thicknesses are within the contemplated scope of embodiments of the invention. The second inner magnetic layer 402 can have a same thickness, a larger thickness, or a smaller thickness as the inner magnetic layer 202 in the first inner layer region 200.

The insulating layer 404 can be made of any suitable non-magnetic insulating material and can be formed using any suitable process in a similar manner as the insulating layer 204. As discussed previously herein, the target thickness of the insulating layers in the second inner layer region 400 (e.g., insulating layer 404) is adjusted to increase the effective permeability of the inner layers and to shift the frequency of peak Q to a higher frequency. In some embodiments, the insulating layer 404 is conformally formed to a relatively thin thickness (i.e., a thickness of about 0.5 nm to about 20 nm, although other thicknesses are within the contemplated scope of embodiments of the invention) to increase losses and to shift the frequency of peak Q to a higher frequency. The insulating layer 404 can have a same thickness, a larger thickness, or a smaller thickness as the insulating layer 204 in the first inner layer region 200.

Figure 5:
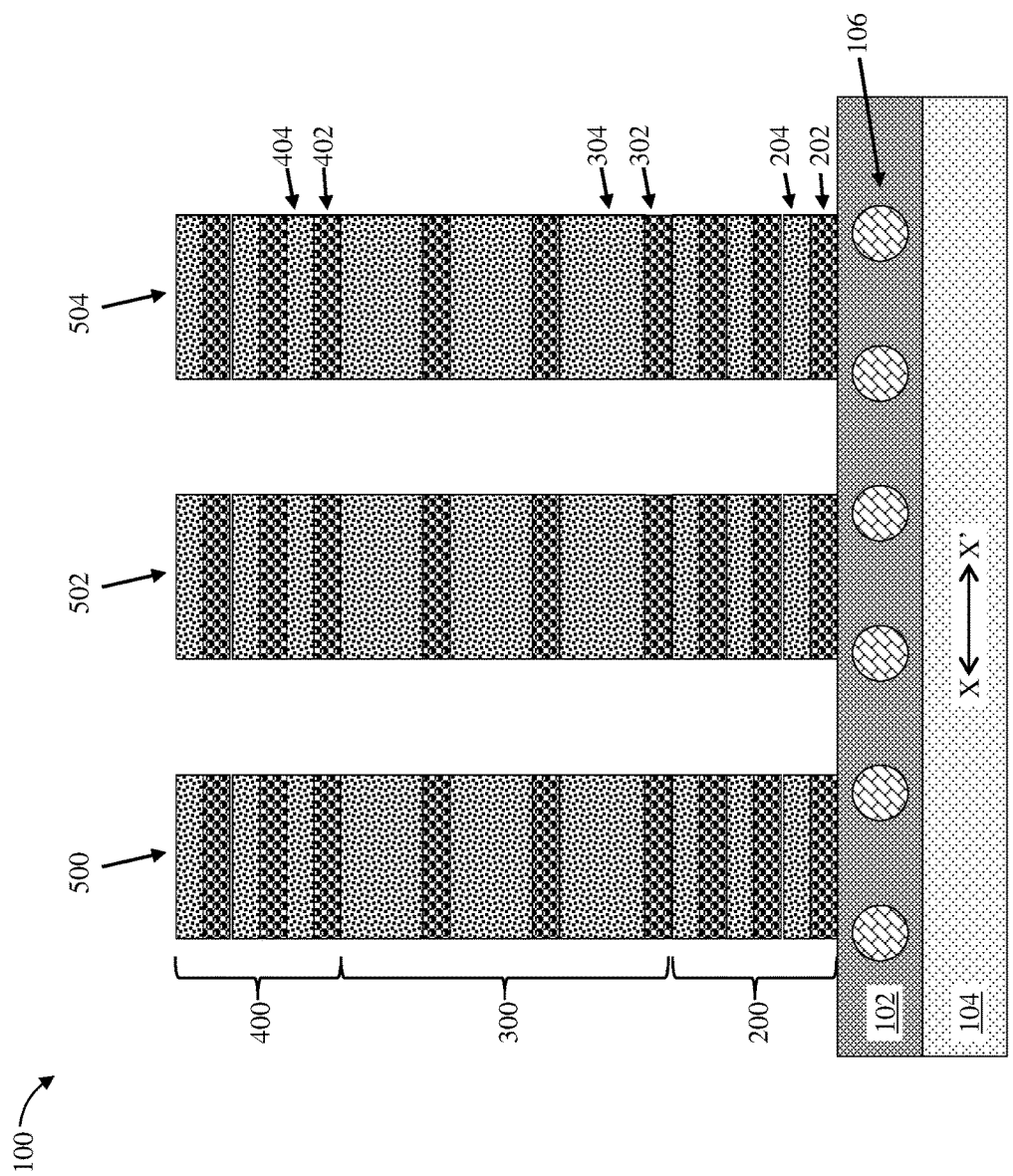
FIG. 5 depicts a laminated magnetic inductor after a fabrication operation according to embodiments of the invention.

FIG. 5 depicts a cross-sectional view of the structure 100 along the direction X-X' after patterning the first inner layer region 200, the outer layer region 300, and the second inner layer region 400 to form laminated stacks 500, 502, and 504 during an intermediate operation of a method of fabricating a semiconductor device according to embodiments of the invention. Any known method for patterning laminated stacks can be used, such as, for example, a wet etch, a dry etch, or a combination of sequential wet and/or dry etches. In some embodiments, the laminated stacks 500, 502, and 504 are formed by removing portions of the first inner layer region 200, the outer layer region 300, and the second inner layer region 400 selective to the dielectric layer 102. For ease of discussion the structure 100 is depicted as having three laminated stacks (e.g., the laminated stacks 500, 502, and 504). It is understood, however, that the structure 100 can include any number of laminated stacks. For example, the structure 100 can include a single laminated stack, two laminated stacks, five laminated stacks, eight laminated stacks, or any number of laminated stacks.

Figure 6:
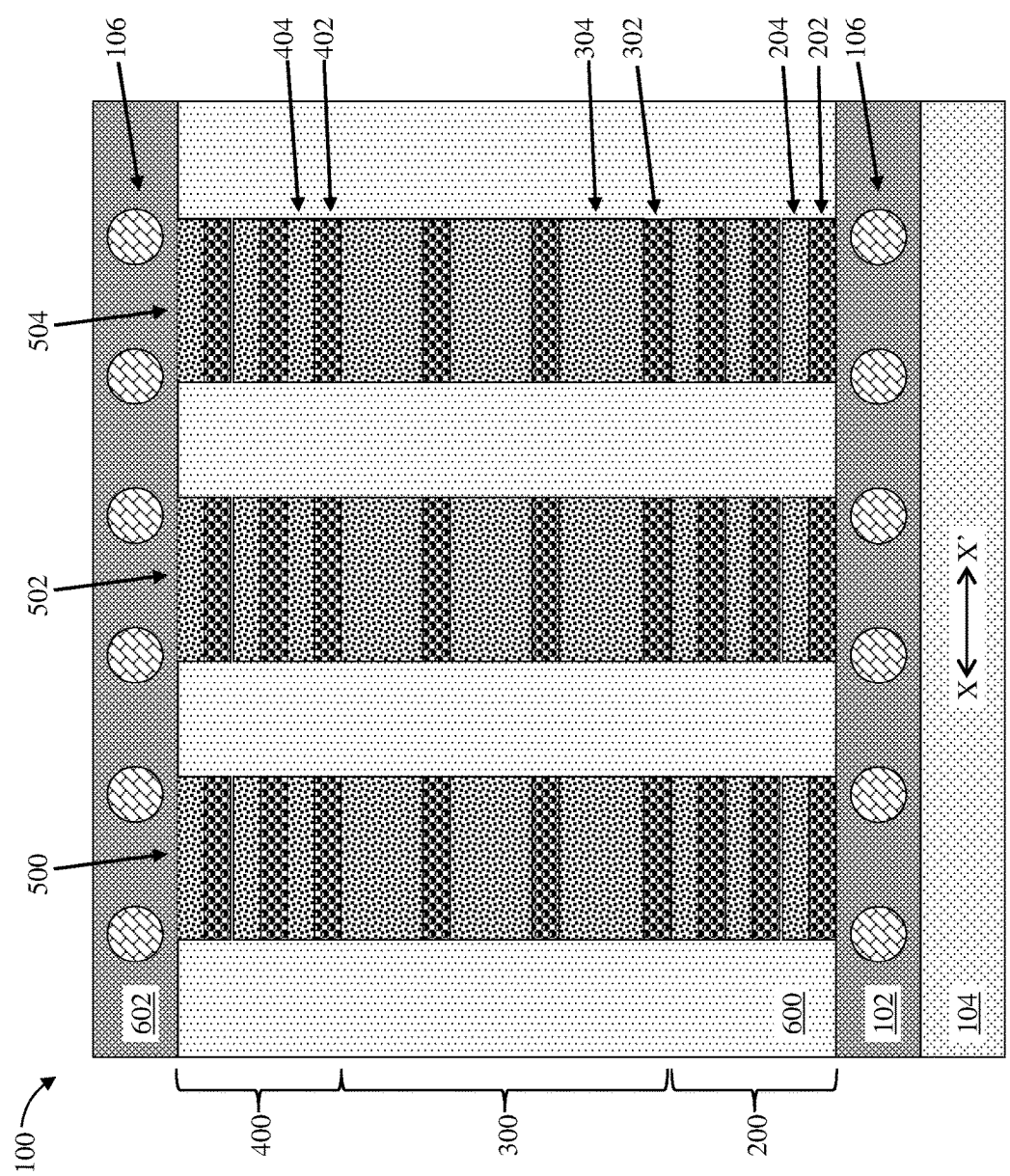
FIG. 6 depicts a laminated magnetic inductor after a fabrication operation according to embodiments of the invention.

FIG. 6 depicts a cross-sectional view of the structure 100 along the direction X-X' after forming a dielectric layer 600 opposite a surface of the dielectric layer 102 during an intermediate operation of a method of fabricating a semiconductor device according to embodiments of the invention. The dielectric layer 600 can be any suitable insulating material, such as, for example, a low-k dielectric, $SiO_2$, SiON, and SiOCN. Any known manner of forming the dielectric layer 600 can be utilized. In some embodiments, the dielectric layer 600 is $SiO_2$ conformally formed opposite a surface of the dielectric layer 102 using a conformal deposition process such as PVD, CVD, PECVD, or a combination thereof. In some embodiments, the dielectric layer 600 is conformally formed to a thickness sufficient to cover a surface of the laminated stacks 500, 502, and 504. In some embodiments, a CMP selective to the laminated stacks 500, 502, and 504 planarizes the dielectric layer 600 to a surface of the laminated stacks 500, 502, and 504.

A dielectric layer 602 (also referred to as a top dielectric layer) is formed opposite a surface of the dielectric layer 600 during an intermediate operation of a method of fabricating a semiconductor device according to embodiments of the invention. The dielectric layer 602 can be any suitable material, such as, for example, a low-k dielectric, SIN, $SiO_2$, SiON, and SiOCN. Any known manner of forming the dielectric layer 602 can be utilized. In some embodiments, the dielectric layer 602 is $SiO_2$ conformally formed on exposed surfaces of the dielectric layer 600 using a conformal deposition process such as PVD, CVD, PECVD, or a combination thereof. In some embodiments, the dielectric layer 602 is conformally formed to a thickness of about 50 nm to about 400 nm, although other thicknesses are within the contemplated scope of embodiments of the invention.

As discussed previously herein, the conductive coil 106 is formed in the dielectric layer 602 and helically wraps around portions of the structure 100. For ease of discussion reference is made to operations performed on and to a conductive coil 106 having six turns or windings formed in the dielectric layer 602. It is understood, however, that the dielectric layer 602 can include any number of windings. For example, the dielectric layer 602 can include a single winding, 2 windings, 5 windings, 10 windings, or 20 windings, although other winding counts are within the contemplated scope of embodiments of the invention.

Figure 7:
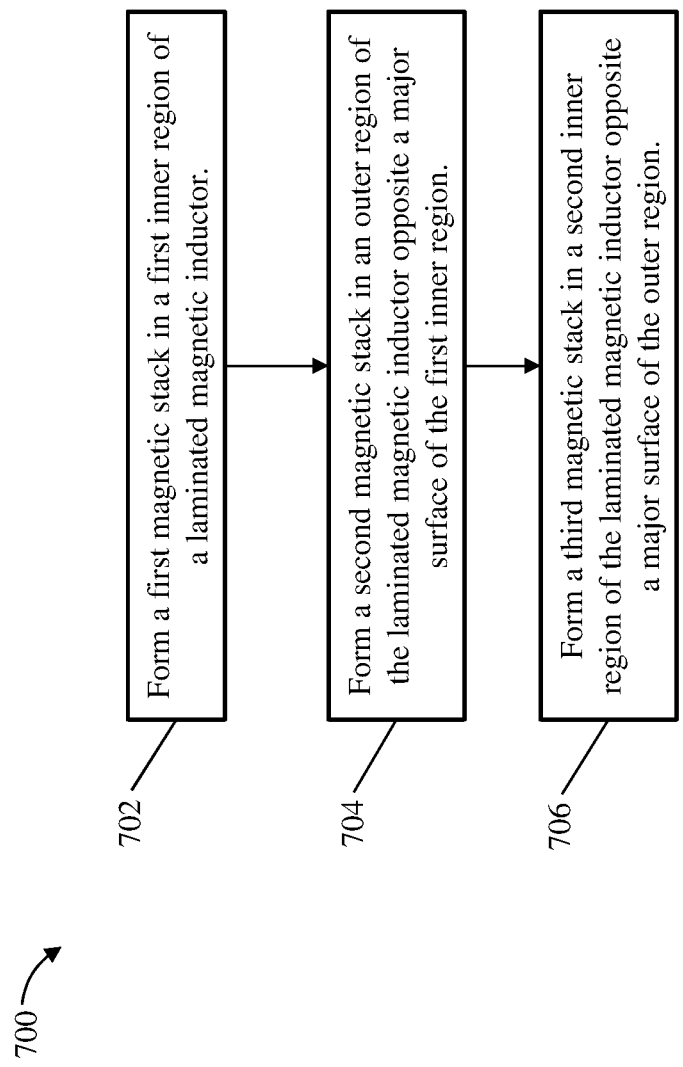
FIG. 7 depicts a flow diagram illustrating a method according to one or more embodiments of the invention.

FIG. 7 depicts a flow diagram illustrating a method for forming a laminated magnetic inductor according to one or more embodiments of the invention. As shown at block 702, a first magnetic stack having one or more magnetic layers alternating with one or more insulating layers is formed in a first inner region of a laminated magnetic inductor. The magnetic layers of the first magnetic stack can be formed in a similar manner as the inner magnetic layer 202 (as depicted in FIG. 2) according to one or more embodiments. The insulating layers of the first magnetic stack can be formed in a similar manner as the insulating layer 204 (as depicted in FIG. 2) according to one or more embodiments.

As shown at block 704, a second magnetic stack having one or more magnetic layers alternating with one or more insulating layers is formed in an outer region of the laminated magnetic inductor opposite a surface of the first inner region. The magnetic layers of the second magnetic stack can be formed in a similar manner as the outer magnetic layer 302 (as depicted in FIG. 3) according to one or more embodiments. The insulating layers of the first magnetic stack can be formed in a similar manner as the insulating layer 304 (as depicted in FIG. 3) according to one or more embodiments.

As shown at block 706, a third magnetic stack having one or more magnetic layers alternating with one or more insulating layers is formed in a second inner region of the laminated magnetic inductor opposite a surface of the outer region. The magnetic layers of the third magnetic stack can be formed in a similar manner as the second inner magnetic layer 402 (as depicted in FIG. 4) according to one or more embodiments. The insulating layers of the third magnetic stack can be formed in a similar manner as the insulating layer 404 (as depicted in FIG. 4) according to one or more embodiments.

As discussed previously herein, the first, second, and third magnetic stacks are structured such that a thickness of the insulating layers in the outer layer region 300 is greater than a thickness of the insulating layers in the first inner layer region 200 or the second inner layer region 400. In this manner, eddy current losses can be leveraged in the critical regions (i.e., the first and second inner regions 200 and 400) to modulate the frequency of peak Q while still mitigating losses in the noncritical regions (i.e., the outer region 300).

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating a magnetic stack arrangement of a laminated magnetic inductor, the method comprising:
    forming a first magnetic stack comprising one or more magnetic layers alternating with one or more insulating layers in a first inner region of the laminated magnetic inductor;
    forming a second magnetic stack comprising one or more magnetic layers alternating with one or more insulating layers opposite a surface of the first magnetic stack in an outer region of the laminated magnetic inductor; and
    forming a third magnetic stack comprising one or more magnetic layers alternating with one or more insulating layers opposite a surface of the second magnetic stack in a second inner region of the laminated magnetic inductor;
    wherein a thickness of an insulating layer in the second magnetic stack is greater than a thickness of an insulating layer in the first magnetic stack.

2. The method of claim 1 further comprising forming a first dielectric layer opposite a surface of the first magnetic stack.

3. The method of claim 2 further comprising forming a second dielectric layer opposite a surface of the third magnetic stack.

4. The method of claim 3 further comprising forming a conductive coil helically wrapping through the first and second dielectric layers.

5. The method of claim 4, wherein the first and third magnetic stacks are positioned proximate to the conductive coil.

6. The method of claim 5, wherein the second magnetic stack is positioned between the first and third magnetic stacks such that the second magnetic stack is further from the conductive coil than either the first magnetic stack or the second magnetic stack.

7. The method of claim 1, wherein the one or more magnetic layers in the first magnetic stack comprise cobalt (Co), FeTaN, FeNi, FeAlO, or a combination thereof.

8. The method of claim 1, wherein the one or more magnetic layers in the first magnetic stack comprises a thickness of about 50 nm to about 500 nm.

9. The method of claim 1, wherein the one or more insulating layers in the first magnetic stack comprise alumina ($Al_2O_3$), silicon dioxide ($SiO_2$), a silicon nitride, a silicon oxynitride ($SiO_xN_y$), magnesium oxide (MgO), or a combination thereof.

10. The method of claim 1, wherein the one or more insulating layers in the first magnetic stack comprises a thickness of about 0.5 nm to about 20 nm.

11. The method of claim 10, wherein the one or more insulating layers in the first magnetic stack comprises a thickness of about 1 nm to about 5 nm.

12. The method of claim 1, wherein the thickness of an insulating layer in the second magnetic stack is at least ten times greater than a thickness of an insulating layer in the first magnetic stack.

13. The method of claim 1, wherein the thickness of an insulating layer in the second magnetic stack is at least twenty times greater than a thickness of an insulating layer in the first magnetic stack.

* * * * *